United States Patent [19]
Tran et al.

[11] Patent Number: 5,545,899
[45] Date of Patent: Aug. 13, 1996

[54] SOLID STATE RADIATION DETECTION PANEL HAVING TILED PHOTOSENSITIVE DETECTORS ARRANGED TO MINIMIZE EDGE EFFECTS BETWEEN TILES

[75] Inventors: Nang T. Tran, Lake Elmo; Joseph Y. Pai; Choon-Woo Kim, both of Woodbury, all of Minn.

[73] Assignee: Minnesota Mining and Manufacturing Company, St. Paul, Minn.

[21] Appl. No.: 410,773

[22] Filed: Mar. 27, 1995

Related U.S. Application Data

[63] Continuation of Ser. No. 163,147, Dec. 6, 1993, Pat. No. 5,436,458.

[51] Int. Cl.$^6$ .............................. G01T 1/24; H01L 31/09
[52] U.S. Cl. .................. 250/370.09; 250/370.11
[58] Field of Search ................ 250/370.09, 370.11, 250/332; 257/444, 443

[56] References Cited

U.S. PATENT DOCUMENTS

| | | | |
|---|---|---|---|
| 4,467,342 | 8/1984 | Tower | 257/443 |
| 4,810,881 | 3/1989 | Berger et al. | 250/370.01 |
| 4,905,265 | 2/1990 | Cox et al. | 378/98.8 |
| 5,043,582 | 8/1991 | Cox et al. | 250/370.09 |
| 5,105,087 | 4/1992 | Jagielinski | 250/370.09 |
| 5,220,170 | 6/1993 | Cox et al. | 250/370.09 |
| 5,248,885 | 9/1993 | Sato et al. | 250/370.15 |
| 5,336,879 | 8/1994 | Sauer | 250/208.1 |

OTHER PUBLICATIONS

Burke et al, "An Abuttable CCD Imager for Visible and X-Ray Focal Plane Arrays", IEEE *Transactions on Electron Devices*, vol. 38, No. 5, pp. 1069–1076 (May 1991).

Harrison et al, "Large Area Focal Plane Comprising Charge-Coupled Devices and Fiber Optics", *Optical Engineering*, vol. 26, No. 9, pp. 897–901 (Sep. 1987).

Burke et al, "420×420 Charge-Coupled-Device Imager and Four Chip Hybrid Focal Plane, *Optical Engineering*, vol. 26, No. 9, pp. 890–896 (Sep. 1987).

Chan, William S., "Focal Plane Architecture: an Overview", SPIE, vol. 217, pp. 2–7, (1980).

*Primary Examiner*—Constantine Hannaher
*Attorney, Agent, or Firm*—Gary L. Griswold; Walter N. Kirn; William D. Bauer

[57] ABSTRACT

A solid state radiation detection panel adapted to receive radiation, having a plurality of modules positioned immediately adjacent each other, with each of the plurality of modules having an array of photosensitive detectors arranged in a plurality of rows and columns, each of the photosensitive detectors having a radiation sensitive area; and circuit means for selectively addressing one of the photosensitive detectors by addressing one of the plurality of rows and one of the plurality of columns and reading the output of the one of the array of photosensitive detectors where each of the plurality of modules being arranged in a three dimensional structure in which the array of photosensitive detectors is arranged on a planar first surface of the module covering substantially the entire area of the planar first surface. The circuit means is located within the module in an area away from the planar first surface opposite from the received radiation. Photosensitive detectors located along an edge of the module having non-radiation sensitive circuitry located opposite the edge from the radiation sensitive area. The radiation sensitive area of the edge photosensitive detectors are smaller than the radiation sensitive area of the inside photosensitive detectors and the center to center distance of the radiation sensitive area of adjacent photosensitive detectors is maintained substantially constant between adjacent edge photosensitive detectors as adjacent inside photosensitive detectors. The module further has a pin diode along the edge of the module.

6 Claims, 6 Drawing Sheets

SOLID STATE RADIATION DETECTION PANEL HAVING TILED PHOTOSENSITIVE DETECTORS ARRANGED TO MINIMIZE EDGE EFFECTS BETWEEN TILES

This is a continuation of application No. 08/163,147, filed Dec. 6, 1993, now U.S. Pat. No. 5,436,458, issued Jul. 25, 1995.

TECHNICAL FIELD

This invention relates generally to solid state radiation detection panels and, more particularly to large area solid state radiation detection panels constructed by adjoining a plurality of single unit sensor tiles.

BACKGROUND OF THE INVENTION

X-rays are commonly used to diagnose medical conditions in humans and animals and in many industrial uses. For medical purposes, an object, typically a portion of the body of a person or animal, is exposed to X-rays while positioned in proximity of a radiation sensitive media. A latent image of the object is formed in the radiation sensitive media which can be subsequently developed to aid the medical practitioner in viewing aspects of the body which can not be directly visually seen. Conventionally, silver halide films in conjunction with a light emitting phosphor sensitive to X-rays are used for this purpose.

More recently, radiation detectors have been constructed which eliminate the use of silver halide films in the detection of the object subjected to X-ray radiation. Radiation detectors are designed to detect incident radiation and convert that incident radiation into an electrical signal which can be utilized to construct a pixel by pixel representation of the image. A radiation detector is sensitive to X-rays but instead of forming an image of the object in silver halide film, the radiation detector directly converts the energy contained in the X-rays to electrical signals. These electrical signals can then be digitized, if they aren't already digital, and can digitally represent the image of the exposed object in a pixel by pixel basis. The digital representation of the image can then be viewed on conventional displays or monitors, transmitted to remote sites, stored electronically and printed in imagers to provide a visual output similar to that which medical practitioner is accustomed.

Such radiation detectors typically involve an array of photosensitive detector elements constructed in array to form an entire X-ray image. Typical X-ray images are 14 inches (35.6 centimeters) by 17 inches (43.2 centimeters) and typically comprise an array of pixels of approximately 4,000×5,000. Thus, as many as 20,000,000 pixels may be contained in a single image.

Since direct digital radiation detectors are formed with an individual photosensitive element for each pixel of image, the same number or a greater number of individual photosensitive elements are required. Such photosensitive elements are typically formed using integrated circuit technology. Not only are such difficult to construct in a size useful for radiology the yield of such devices decreases rapidly as the size increases.

Thus, a tiling approach has been used to construct large radiation detectors. Using this approach, a plurality, typically a large number, of individual radiation sensitive tiles are constructed, typically using integrated circuit technology. The tiles are relatively small and, thus, relatively easy to manufacture using conventional techniques. The individual tiles are then placed adjacent each to form a large radiation detector suitable for use with conventional X-ray machines.

The tiling approach, however, has many problems. Since each individual tile has a surface onto which X-ray radiation is incident and since only a part of that surface of actually sensitive to X-ray radiation, the overall radiation detector has many "dead spots" or areas which are insensitive to the X-ray radiation.

The tiling approach has been widely studied, especially in the area of charge coupled devices (CCD's). In U.S. Pat. No. 4,467,342, thinned imager chips are arranged end-to-end and accurately positioned relative to one another so that the proper spacing period between adjacent imager pixel detectors is maintained. However, the chips are put together by using a lap joint (shingling) rather than a butt joint. The lap joint method creates a non-uniform surface which in turn translates into a non-uniform coating of the phosphor covering the chips. This non-uniformity can cause scattering of the X-rays leading to loss in resolution and also to loss of information at the tile overlap interface due to insufficient coverage of the phosphor.

In U.S. Pat. No. 4,810,881, a method of making a large area X-ray detector is described which comprises several detector chips placed end-to-end. Each chip has its own addressing and reading circuits. The addressing circuit is located on an edge of the insulating substrate that bears the detectors and the reading circuit is located on the opposite side of the substrate from the detectors. In this method each tile must allow sufficient space between the tiles for column connections thus leading to dead space resulting in loss of information.

In U.S. Pat. No. 5,105,087, the assembly of a large area X-ray sensor which is formed from a plurality of smaller solid state sensors is described. The large area sensor includes at least a first solid state sensor having an X-ray detector region and a blind non-detector border region. Positioned adjacent to the first sensor is a second solid state sensor having an X-ray detector region and a blind non-detector border region with respective non-detector regions being contiguous. A third solid state sensor having an X-ray detector region is positioned to overlie the first and second solid state sensors in such a way that the X-ray detector region of the third sensor overlies the blind non-detector regions of the first and second sensors, however, the third sensor also incorporates a blind non-detecting region. In this method the alignment of the third solid state sensor is very critical and difficult to accomplish. The placement of the third solid state sensor on top of the first and second sensors results in a non-uniform surface. This non-uniformity can cause scattering of the X-rays leading to loss in resolution.

In a typical sensor chip, described in the previously mentioned patents, the radiation sensitive area is contained at the center and is surrounded by the radiation non-sensitive area which is utilized for the addressing, read-out and metal contacts, thus leading to inevitable loss of information in the conventional large area sensors.

SUMMARY OF THE INVENTION

The present invention provides a solid state radiation detection panel which has eliminated surface discontinuities caused by lap joints and two layer tile arrays. Further, the solid state radiation detection panel of the present invention minimizes the portion of the radiation incident surface which is not sensitive to the incident radiation. Further, in preferred embodiments, the center to center distance of edge pixels from one tile to the next is kept constant to provide uniformity of image detection.

In one embodiment, a solid state radiation detection panel is adapted to receive radiation. The radiation detection panel has a plurality of modules positioned immediately adjacent each other. Each of the plurality of modules has an array of photosensitive detectors arranged in a plurality of rows and columns with each of the photosensitive detectors having a radiation sensitive area. Each of the plurality of modules also has an addressing circuit for selectively addressing one of the photosensitive detectors by addressing one of the plurality of rows and one of the plurality of columns and reading the output of the one of the array of photosensitive detectors. Each of the plurality of modules is arranged in a three dimensional structure in which the array of photosensitive detectors is arranged on a planar first surface of the module covering substantially the entire area of the planar first surface. The addressing circuit is located within the module in an area away from the planar first surface opposite from the received radiation. In this way, the radiation detection panel has a nearly contiguous radiation sensitive area over the first surface of the solid state radiation detection panel.

In another embodiment, the present invention is a solid state radiation detection panel adapted to receive radiation on a first surface. The solid state radiation detection panel has a common substrate, preferably glass, a plurality of modules each of which has an array of photosensitive detectors arranged in a plurality of rows and a plurality of columns. Each of the photosensitive detectors has a radiation sensitive area and produces an output. An addressing and reading circuit selectively addresses one of the photosensitive detectors by addressing one of the plurality of rows and one of the plurality of columns and reads the output of the one of the array of photosensitive detectors. Each of the plurality of modules is arranged in a three dimensional structure in which the array of photosensitive detectors on the first surface covers substantially the entire area of the first surface and in which the addressing and reading circuit is located within the module in an area away from the first surface opposite from the received radiation. The plurality of modules of the solid state radiation detection panel are positioned immediately adjacent each other resulting in a near contiguous radiation sensitive area over the entire surface of the solid state radiation detection panel receiving the radiation. Panel addressing means for selectively addressing one of the photosensitive detectors in each of the plurality of modules by addressing the circuit within each of the plurality of modules. A panel reading means selectively reads the output of the one of the array of photosensitive detectors in each of the modules. An interconnection is positioned between the plurality of modules and the common substrate connecting the addressing and reading circuit of each of the plurality of modules to the panel addressing means and to the panel reading means, respectively.

It is preferred that a layer of phosphor be positioned between the radiation sensitive area of the modules and the received radiation.

In another embodiment, a solid state radiation detection panel is adapted to receive radiation incident on a first surface. The solid state radiation detection panel has a plurality of modules having a plurality of edges with at some of the plurality of edges positioned immediately adjacent each other. Each of the plurality of modules has an array of photosensitive detectors, each representing a pixel, arranged on a first surface of the module in a plurality of rows and columns covering substantially the first surface. The photosensitive detectors located along an edge of the module are designated edge photosensitive detectors and the photosensitive detectors located interior of the module are designated inside photosensitive detectors. Each of the photosensitive detectors has a radiation sensitive area and non-radiation sensitive circuitry associated with one of the photosensitive detectors. Each of the edge photosensitive detectors has the non-radiation sensitive circuitry located opposite the edge from the radiation sensitive area.

Preferably, the radiation sensitive area of the edge photosensitive detectors are smaller than the radiation sensitive area of the inside photosensitive detectors and wherein a distance from center to center of the radiation sensitive area of adjacent photosensitive detectors is maintained substantially constant between adjacent edge photosensitive detectors as adjacent inside photosensitive detectors. Preferably, the module further has a p/n diode along the edge of the module.

BRIEF DESCRIPTION OF THE DRAWINGS

The foregoing advantages, construction and operation of the present invention will become more readily apparent from the following description and accompanying drawings in which.

DETAILED DESCRIPTION OF THE PREFERRED EMBODIMENTS

Figure 1:
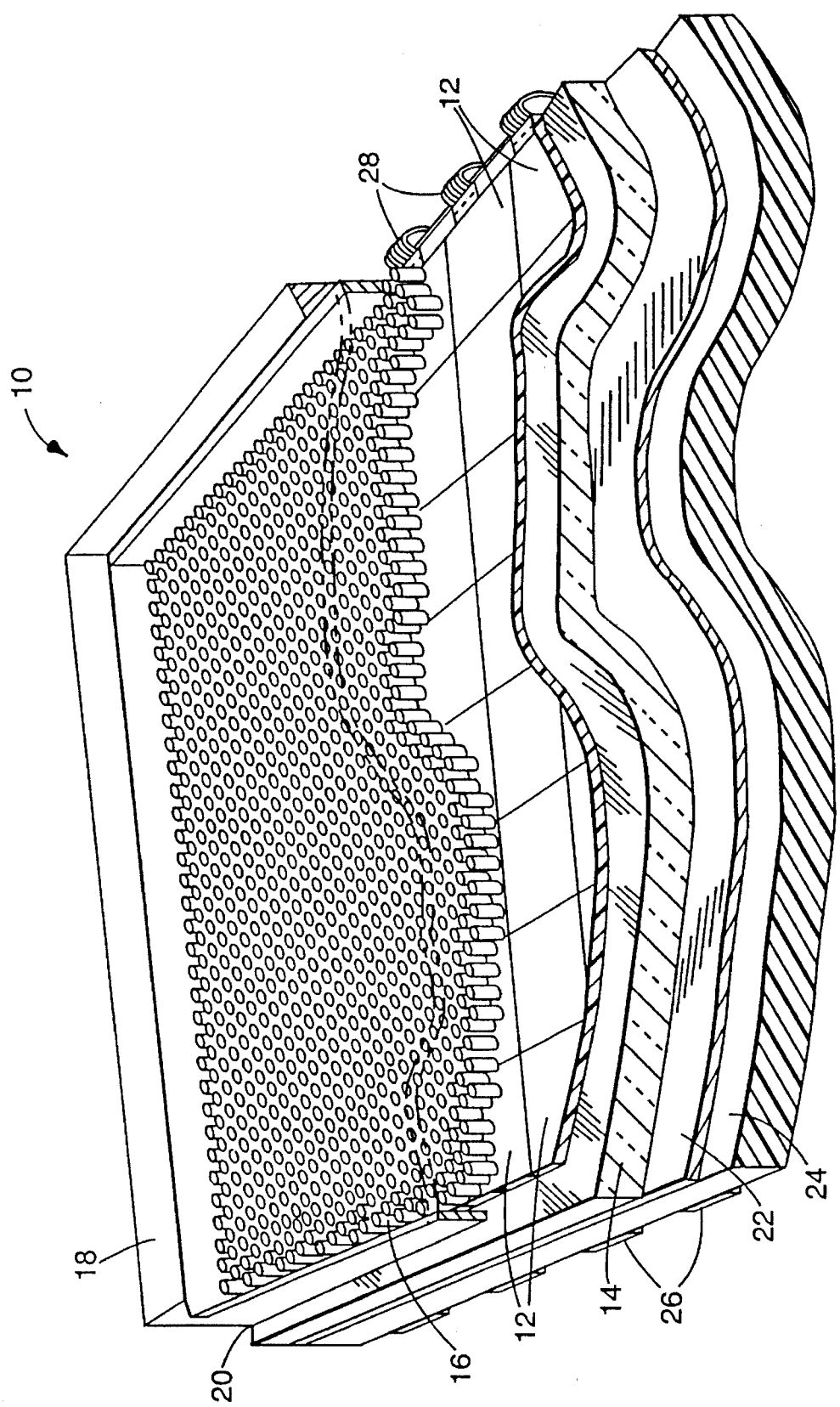
FIG. 1 is a cut away perspective view of one embodiment of a radiation detection panel according to the present invention.

A radiation detection panel 10 is illustrated in FIG. 1. Individual photosensitive modules 12 are arranged in a plurality of rows and columns and are mounted on a flat substrate 14, such as a glass plate. Each individual module, or tile, 12 is responsive to incident radiation from the top as illustrated in FIG. 1. On top of the photosensitive modules 12 is a layer of phosphor 16. Covering the top of radiation detection panel 10 is a protective front plate 18 which protects the underlying phosphor layer 16 and photosensitive tiles 12 with a hermetic seal 20. Below substrate 14 is an optional lead separator 22 designed to protect underlying electronic components from radiation exposure. Below separator 22 and opposite from the side of incident radiation is a printed wiring board 24 containing appropriate electronic components 26 associated with radiation detection panel 10. Flexible cable 28 provides an electrical connection between electrical contacts on the common substrate 14 connecting to electrical components within each tile 12 and electronic components 26 mounted on printed wiring board 24 opposite separator 22.

In operation, X-ray radiation (after being modulated according to the object being imaged) is incident on the top surface (the surface containing front plate 18). The radiation passes through front plate 18 and strikes the layer of phosphor 16 which operates as a scintillation material converting the X-ray radiation into visible light. Visible light emitted by the phosphor 16 is detected by an array of photosensitive detectors in each of tiles 12. The photosensitive detectors convert the visible radiation into an electrical signal which may be read-out to associated electronic circuits. The value, typically digital, of the electronic signals then represents an imagewise pattern of the object being imaged.

In addition to the photosensitive detectors in each tile 12, other peripheral circuitry is used to address and read-out the charge held by individual photosensitive detectors. Within each photosensitive detector there are three TFT (thin film transistors) switches, one for each of the x and y directions and one for read-out purposes.

Figure 2:
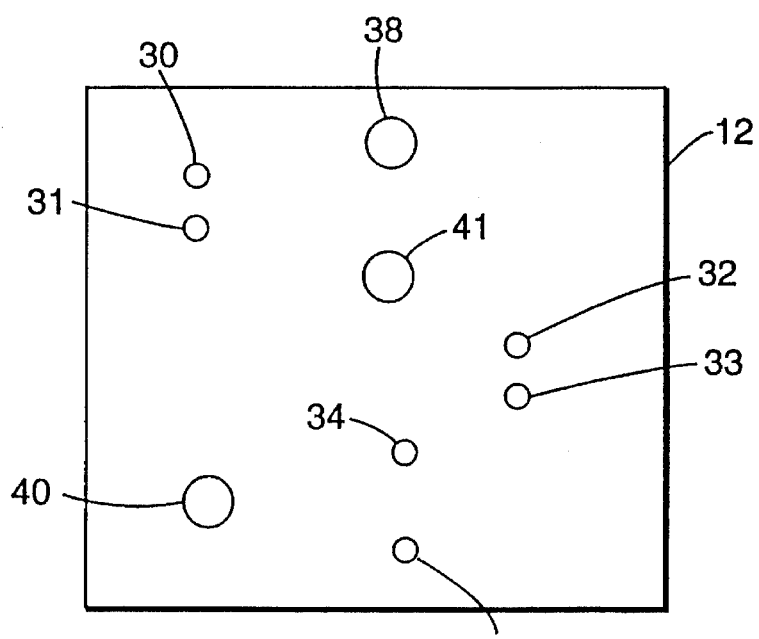
FIG. 2 is a view of an individual photosensitive module array (tile) facing the common glass substrate utilized in the radiation detection panel of the present invention.

In a preferred embodiment, each tile 12 consists of silicon photodiodes and thin film transistor (TFT) devices formed on silicon wafers, with a dimension of 2.125 inches×2.125 inches (5.4 centimeters×5.4 centimeters). Silicon photodiodes provide the individual photosensitive elements. Preferably, each tile 12 contains a 624 by 624 array of, or 389,376, photosensitive detectors. The addressing and read-out circuitry is distributed within each sensor tile 12 with the interconnection lines for clocks (30, 31, 32 and 33), $V_{out}$ (34, 36), $V_{dd}$ (38), reset (40) and ground (42) exposed on the top as illustrated in FIG. 2. The tiles 12 are thinned out to a thickness of 12–40 microns while maintaining the edges at the original thickness of the silicon wafer (preferably 200 to 400 microns) for purposes of handling ease. A p+ implantation and implantation annealing at 850° Centigrade is done to form a built-in field to drive the carriers away from the surface and to enhance blue light efficiency. Aluminum patterns are then conventionally formed using microlithography. The tiles 12 are then mounted on a phosphor 16. After proper alignment is achieved, the tiles 12 are held in place by a vacuum system and the edges surrounding the tiles 12 is trimmed away. A common substrate 14 is prepared with large metal tracks, with typical track widths in the range of 300–700 microns. The patterned common substrate 14 is then placed on top of the array of tiles 12 and a solder bump operation is performed to connect the metal pads in the tiles 12 to the metal tracks on the common substrate 14.

Alternatively, the phosphor may be coated on a separate sheet or glass substrate and then glued to the array of sensor tiles 12. Alternatively, the entire array of tiles 12 may be coated with phosphor 16. The phosphor 16 may consist of conventional phosphors or pre-structured phosphors, such as gadolinium oxide sulfide doped with terbium or europium or other phosphors known to those skilled in the art. Another alternative phosphor 16 is an alkali halide which can be deposited directly on the sensor tiles 12, using the thin film deposition techniques known in the art. A non-inclusive representative alkali halide phosphor is thallium doped cesium iodide.

Figure 3:
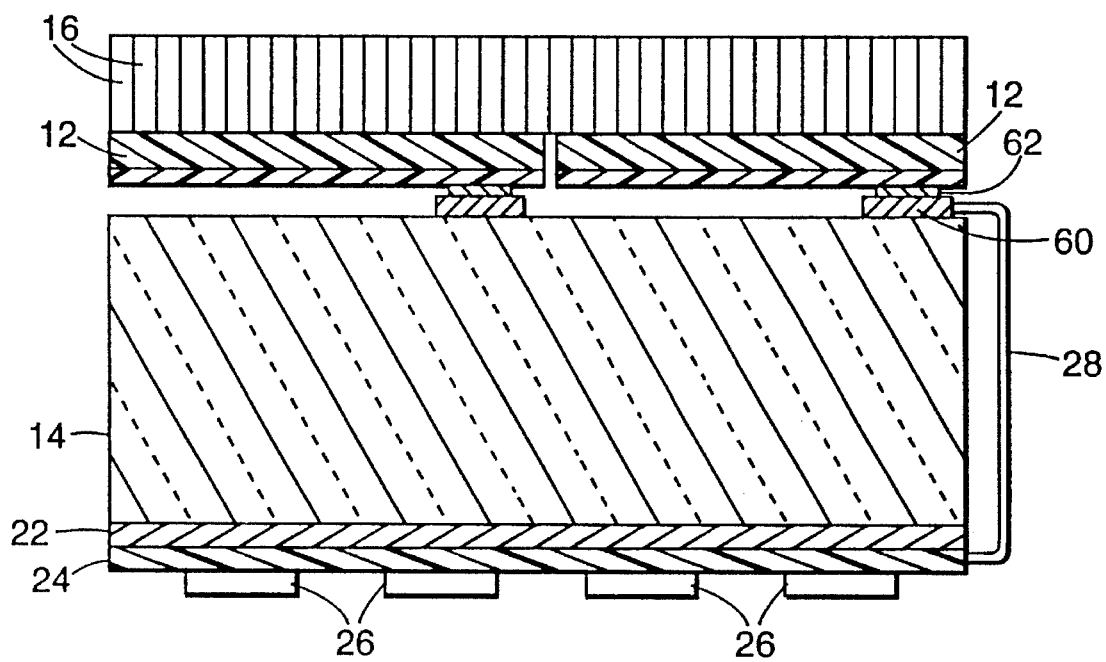
FIG. 3 is a side view of a portion of a radiation detection panel in accordance with the present invention showing two tiles.

A cross sectional view of the tiling method for two tiles 12 is illustrated in FIG. 3. The array of sensor tiles 12 is mounted on a glass plate 14 which is separated from the printed wiring board 24 by a lead plate 22. The lead plate 22 has a typical thickness of 1 millimeter. The lead plate 22 is used to protect the surface mount technology (SMT) devices 26 on the printed wiring board 24 from the possible damage caused by X-ray radiation. The top of the array of sensor tiles 12 are then covered with a front plate 18 and hermetically sealed to keep the array of sensor tiles 12 in an inert gas. A cabling system 28 interconnects the electrical contacts on the common substrate 14 connecting to the components within each tile 12 to the SMT devices 26.

Even though this tiling approach is primarily designed for a large area direct digital read-out sensor, the approach can also be applicable to any sensors where large area is a requirement. One example is a high speed, high quality liquid crystal display. The following describes a process for fabrication of a solid state sensor tile 12.

A $p^-$ epi layer is grown to a thickness of 10–15 microns on a $p^+$ type 4" diameter single crystal silicon wafer, followed by implantation of N well regions and dopants. The NMOS devices are implanted at the peripherals with p field regions to protect the devices from radiation. An isoplanar active area is formed. Silicon nitride is stripped and sacrificial oxide is grown upon the surface. The oxide is then stripped and a gate oxide at a thickness of 250–350 Angstroms is grown at a temperature of 950°–1000° Centigrade. After the threshold control implantation, gate polysilicon is deposited as an amorphous silicon stage with $POCl_3$ followed by annealing to form polysilicon. $N^+$ type is implanted to form the source/drain regions, followed by the deposition of 1,000 to 2,000 Angstroms of silicon oxide as a gate oxide and deposition of Boron Phosphor Silicate Glass (BPSG) at a thickness of 8,000 Angstroms. The contacts are then opened and the edges around the contact openings are rounded by reflowing the BPSG. Aluminum is deposited at a thickness of 12,000 Angstroms to form the horizontal signal lines, peripheral interconnections, etc. An inter-level dielectric layer of Boron Silicate Glass is deposited at a thickness of 10,000 Angstroms and then etched to form vias. Aluminum is then deposited at a thickness of 8,000 Angstroms to form the vertical lines, interconnections, etc. A final scratch protection layer composed of an oxide plus nitride layer is deposited, followed by opening of the pad areas.

Figure 4:
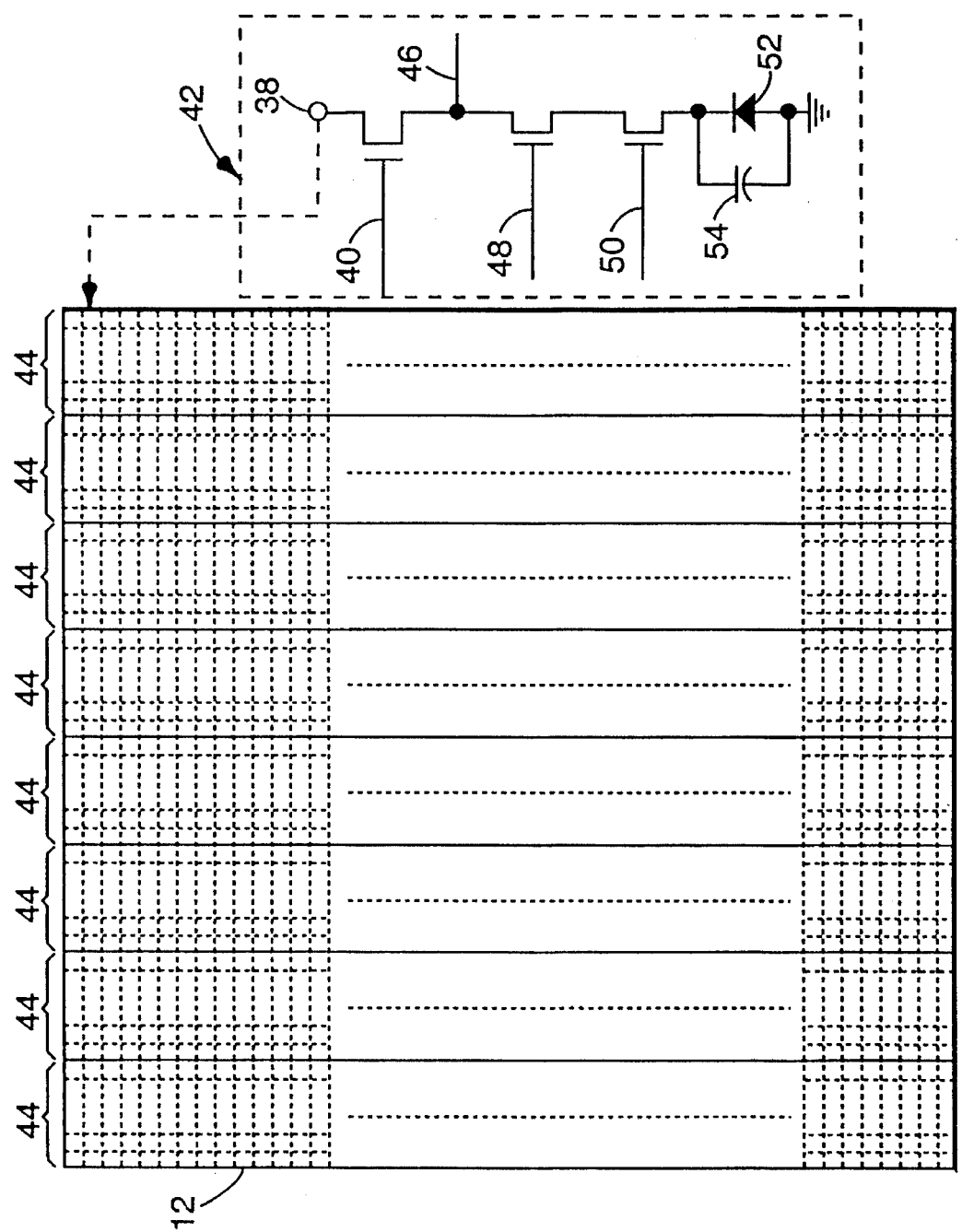
FIG. 4 a schematic representation of an individual tile utilized in the radiation detection panel of the present invention.

A schematic representation of an individual tile 12 can be seen in FIG. 4. Photosensitive module, tile, 12 consists of a 624 by 624 array of photosensitive detectors 42. A photodiode 52 is sensitive to the radiation produced by the phosphor 16. A charge is stored in capacitor 54 based on the intensity of the light generated by the phosphor 16. The entire array is subdivided into eight sub-arrays 44 of 624 pixels by 78 pixels. The read-out line 46 of all photosensitive detectors 42 in each sub-array 44 is connected together. Each individual photosensitive detectors 42 within each sub-array 44 is individually sequentially addressed by shift clock registers (not shown). By subdividing the entire array in eight sub-arrays 44, eight pixels can be read-out of each tile simultaneously.

Each time a signal is provided either to the x address line 48 or to y address line 50, a shift clock register increments by one, so that the next signal that comes in to the x address line 48 or y address line 50 will activate the next pixel in line. For a series of pulses sent to one of the address lines 48 or 50, the pixels activated for reading are "marched down the line".

Only one read-out line is needed for each sub-array 44 of 48,672 pixel (a sub-array of 624 by 78 pixels). The associated addressing and read-out circuitry may be located inside a tile 12 and away from the edges of each tile 12. Such read-out circuitry, beyond that shown in FIG. 4 can be located on printed wiring board 24 on the opposite side of radiation detection panel 10 from the incident radiation.

The interconnect between each read-out line 46 shown in FIG. 4 and a metal track 60 is a solder bump 62. Since the number of metal tracks 60 on the substrate 14 is small, the size of the solder bumps 62 can be quite large (100–700 microns or more). The amount of real estate available in the substrate 14 is large compared with that available in conventional prior art systems which cram 624 x address lines and 624 y address lines into the same area.

Further, for ease of handling and alignment, several solder bumps 62 (redundancy) can be used for each line (metal track 60) contacted with the glass plate 14. In this way, solder bumps 62 can also help provide mechanical support.

Figure 5C:
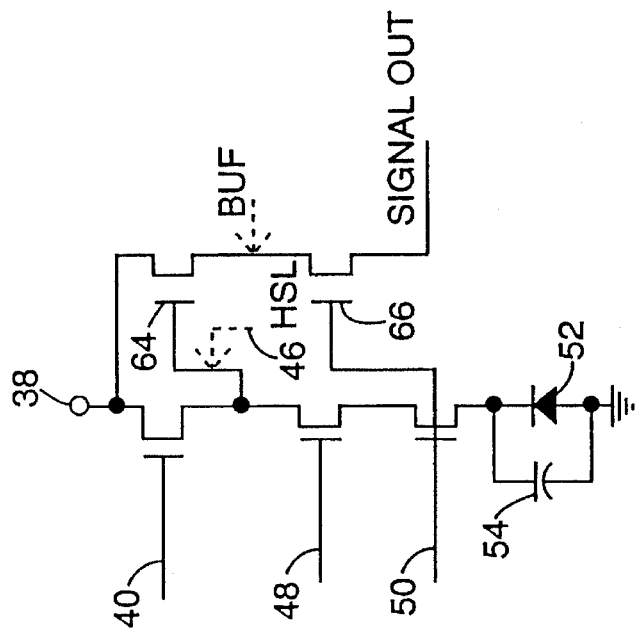
FIG. 5C is a schematic showing the condition of a pixel during read-out.

Operation of the read-out system for each photosensitive module (tile) 12 can be better described by reference to FIG. 5A. Before exposure to X-ray radiation, reset 40 is set to a high level, preferably five volts. The x address line 48 and y address line 50 switches their associated thin film transistor (TFT) switches by applying a high voltage. A voltage is applied across photo-diode 52 for that pixel, to charge the photo-diode to the "full well" potential. "Full well" potential is 40 me$^-$ for a 85×85 micron pixel.

Figure 5B:
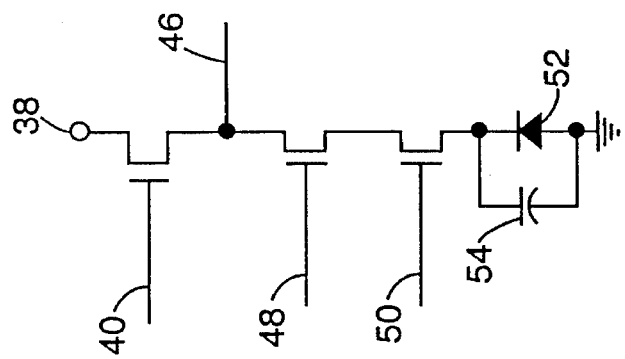
FIG. 5B is a schematic showing the condition of a pixel during exposure.
Figure 5A:
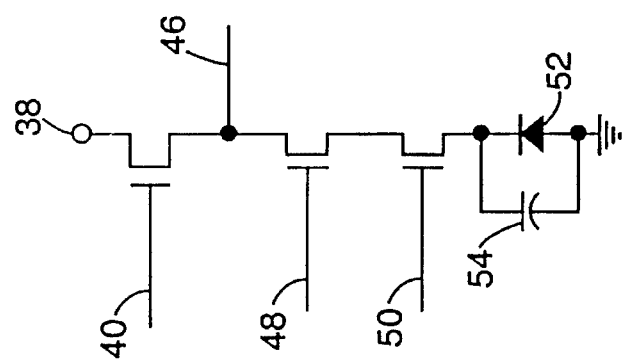
FIG. 5A is a schematic showing the condition of a pixel before exposure.

During exposure as illustrated in FIG. 5B, reset 40 remains high. The x address line 48 and y address line 50 switches their associated TFT off (low voltage) after the exposure has started. By doing this, the photodiode and capacitor are isolated and the "full well" potential starts for "leak out" and reduces the potential across capacitor 54 in proportion to the light intensity from the phosphor 16.

For example, an exposure of 100 mR of X-rays will drop the voltage across capacitor 54 from 5 volts to 1.58 volts. For an X-ray exposure of 0.1 mR, the voltage will drop from 5 volts to approximately 4.27 volts. Exposure is now finished.

Read-out is illustrated by reference to FIG. 5C. Reset 40 is still high at five volts. The x address line 48 and y address line 50 are still low. To read-out, reset 40 is set to low and the x address line 48 and y address line 50 are set to high. The potential across capacitor 54 travels through "source follower" 64 with a gain of one. The "read out" TFT 66 is turned on to permit the signal to pass to "signal out", which goes through the bump 62.

Figure 6:
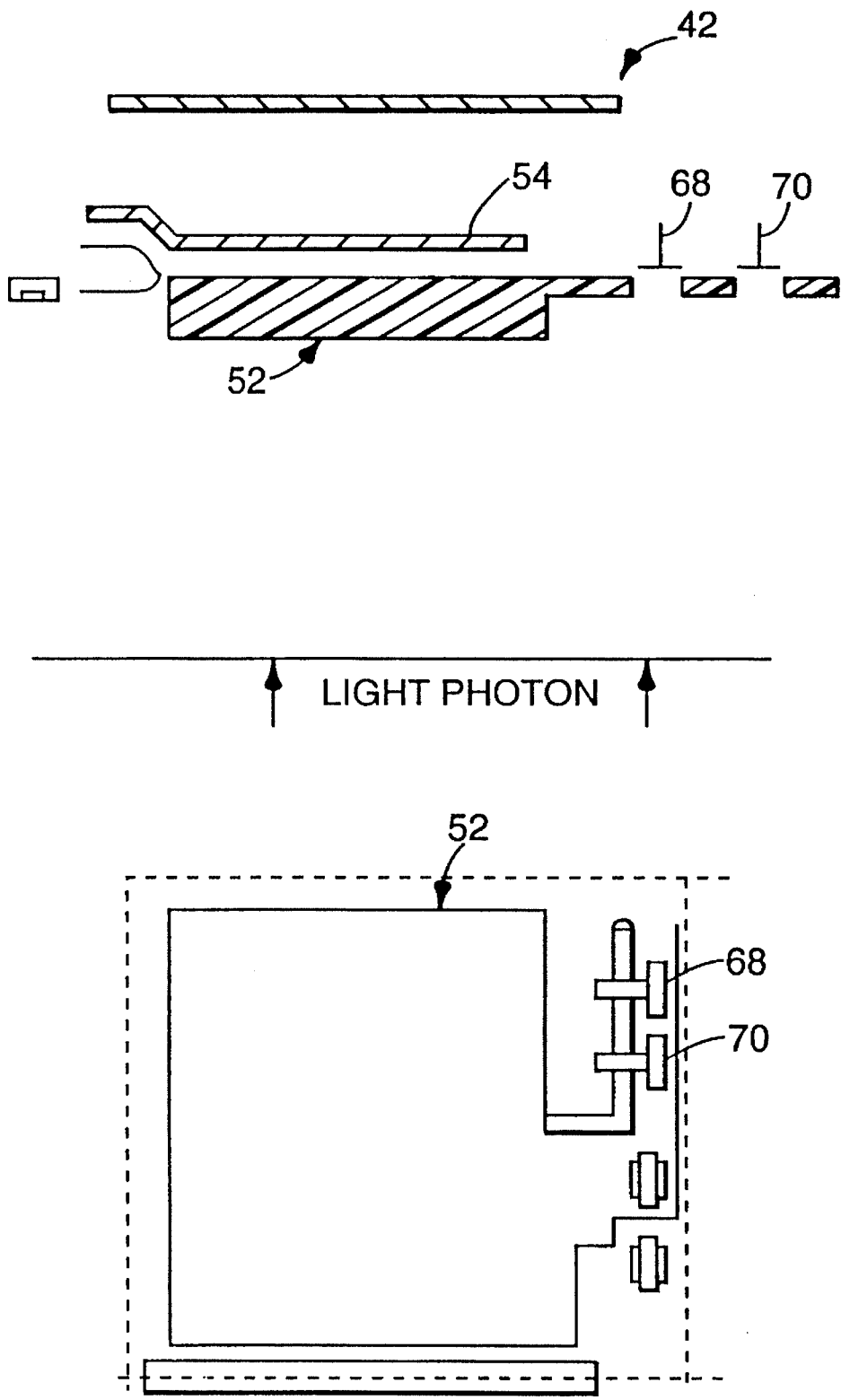
FIG. 6 is a cross-sectional semi-schematic diagram of an individual pixel.

FIG. 6 illustrates the MOS structure of an individual pixel 42 which uses a N-well to P substrate photo-diode 52 to integrate photogenerated charge and employs a thin oxide capacitor 54 i parallel with the photo-diode 52 to increase the charge handling capacity of the pixel. The signal charge is read-out to a common signal line using two series connected NMOS transistors 68, 70 which are controlled by row and column scanning registers integrated in the radiation detection panel 10. The pixel 42 has a size of 85 microns by 85 microns, of which the active area of the photodiode 52 is about 63 microns by 63 microns (or 74% of the surface area).

Figure 7:
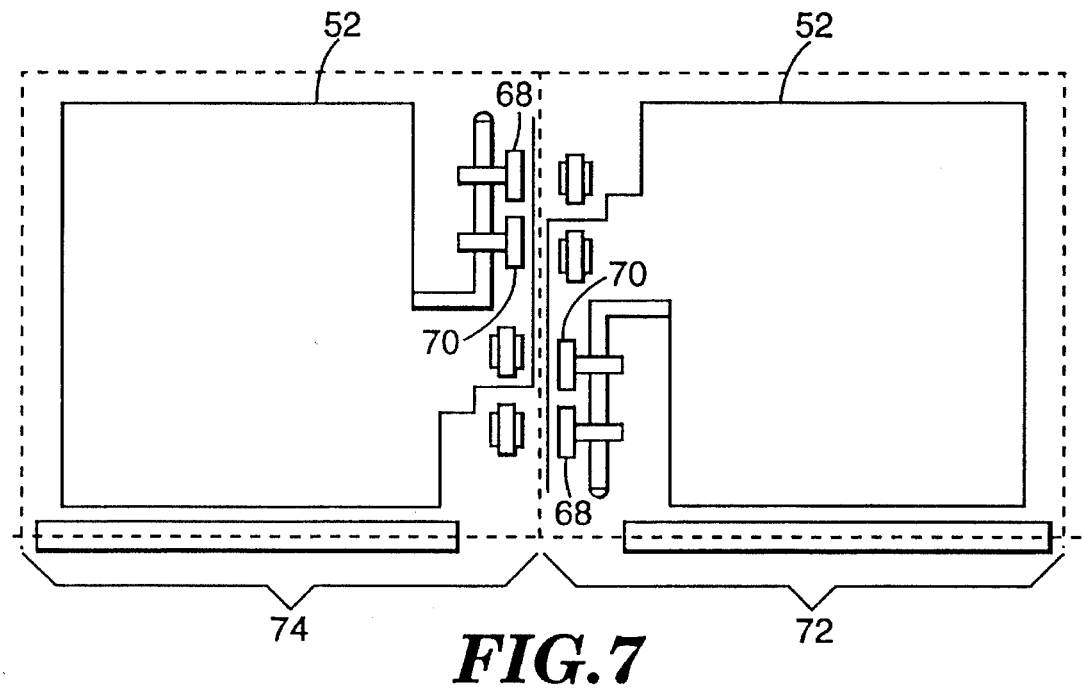
FIG. 7 is a top view of the alignment and positioning of an inside pixel and an outside pixel.

FIG. 7 illustrates two pixels of a tile 12. Pixel 72 is an edge pixel, i.e., a pixel located at the edge of the 624 by 624 pixel tile 12. Pixel 74 is an inside pixel, i.e., a pixel which is completely surrounded by other pixels 42, possibly including an edge pixel such as pixel 72.

It has been found that the gate oxide from transistors 68 and 70 is sensitive to the generation of additional carriers when positioned along the edge of the tile 12 and also due to narrow source/drain length. When the tile is separated with a saw cut, additional carriers are generated. This leads to a degradation in performance of the affected transistors 68 and 70. On the other hand, photo-diode 52, which has a much larger surface area, is much less sensitive to the generation of additional carriers. Therefore, edge pixels such as pixel 72 have transistors 68, 70 located opposite photo-diode 52 from the edge of tile 12. Such positioning reduces performance damage caused the saw cut.

Figure 8:
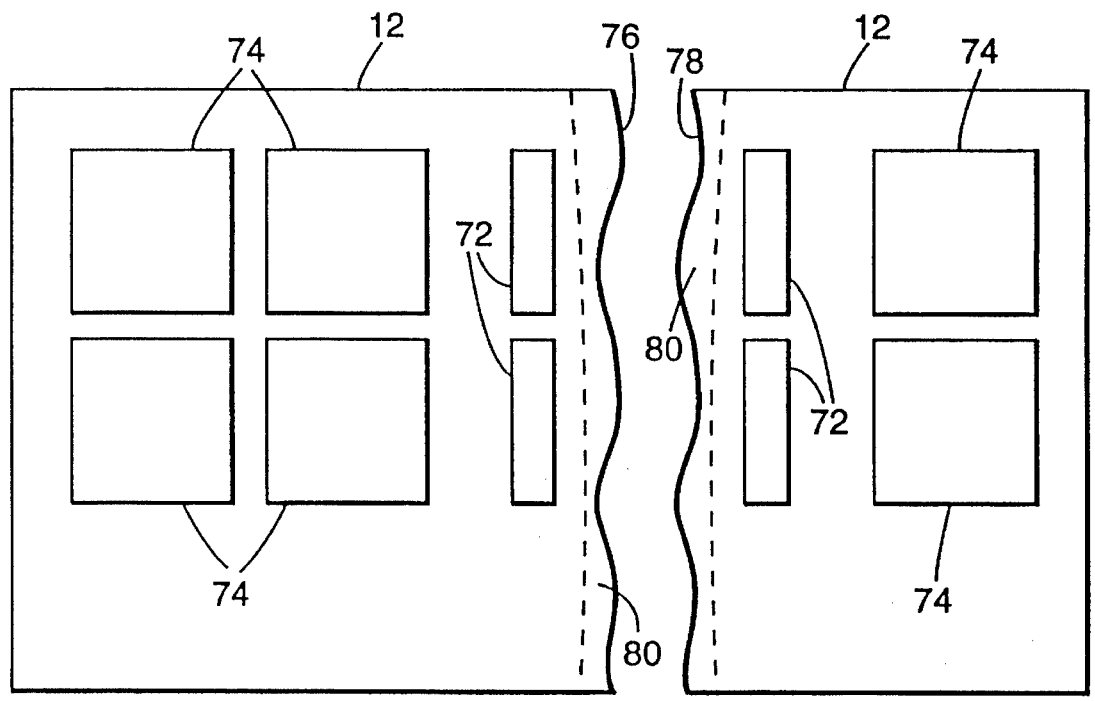
FIG. 8 is a top view of two adjacent tiles illustrating the edge effects and special sizing and alignment of edge pixels of adjacent tiles.

FIG. 8 illustrates edges 76 and 78 of adjacent tiles 12. The photosensitive area of inside pixels 74 are illustrated conventionally. For illustration purposes it appears that tiles 12 end just above the uppermost pixels 74. However, such is not the case. Tiles 12 extend substantially beyond the two partial rows of pixels shown. Therefore, all pixels labeled 74 are inside pixels. The photo-sensitive areas of edge pixels 72 are diminished in order to keep the center to center spacing of all pixels constant. As can be seen in FIG. 8, the distance (center to center) between inside pixels 74, the distance (center to center) between an inside pixel 74 and an edge pixel 72, as well as the distance (center to center) between edge pixels 72 are constant. With constant spacing, pixel alignment will be constant regardless of a pixel is an inside pixel or an edge pixel.

In order to keep the center to center pixel spacing constant, the size of the photo-sensitive area of edge pixels 72 are reduced in size. Image processing can make for the loss in detected sensitivity due to the reduction of the photo-sensitive area of edge pixels 72.

A p/n diode junction 80 is established along the edge of each edge pixel 72 to passivate the additional carriers generated by the saw cut.

Thus, it can be seen that there has been shown and described a novel invention as described above. It is to be recognized and understood, however, that various changes, modifications and substitutions in the form and the details of the present invention may be made by those skilled in the art without departing from the scope of the invention as defined by the following claims.

What is claimed is:

1. A solid state radiation detection panel adapted to receive radiation on a first surface, comprising:

a common substrate;

a plurality of modules, each of said plurality of modules formed on a silicon wafer comprising:

an array of photosensitive detectors arranged in a plurality of rows and a plurality of columns, each of said photosensitive detectors having a radiation sensitive area and producing an output; and circuit means distributed within each of said plurality of modules for selective addressing one of said photosensitive detectors by addressing one of said plurality of rows and one of said plurality of columns and reading said output of said one of said array of photosensitive detectors;

each of said plurality of modules being arranged in a three dimensional structure in which said array of photosensitive detectors are arranged on a first surface of each of said plurality of modules covering substantially the entire area of said first surface, in which said circuit means is located within said module in an area away from said first surface opposite from said received radiation and wherein said plurality of modules of said solid state radiation detection panel are positioned immediately adjacent each other resulting in a near contiguous radiation sensitive area over the entire surface of said solid state radiation detection panel receiving said radiation;

panel addressing means for selectively addressing one of said photosensitive detectors in each of said plurality of modules by addressing said circuit means within each of said plurality of modules;

panel reading means for selectively reading the output of said one of said array of photosensitive detectors in each of said modules; and interconnection means positioned between said plurality of modules and said common substrate for connecting said circuit means of each of said plurality of modules to said panel addressing means and to said panel reading means, respectively.

2. A solid state radiation detection panel as in claim 1 which further comprises a layer of phosphor positioned between said radiation sensitive area of said modules and said received radiation.

3. A solid state radiation detection panel as in claim 1 wherein said panel addressing means and said panel reading means are located opposite said common substrate from said plurality of modules.

4. A solid state radiation detection panel as in claim 3 wherein said interconnection means comprises:

a plurality of electrical contacts located between said common substrate and said plurality of modules, said plurality of electrical contacts making electrical contact with said circuit means within each of said plurality of modules; and a flexible cable connecting said plurality of electrical contacts with said panel addressing means and said panel reading means.

5. A solid state radiation detection panel as in claim 4 wherein said plurality of electrical contacts are a plurality of electrically conductive tracks placed on said common substrate and wherein the number of said electrically conductive tracks is substantially fewer than the number resulting from a multiplication of the number of rows and the number of columns of said solid state radiation detection panel.

6. A solid state radiation detection panel as in claim 5 wherein the number of said electrically conductive tracks is at least an order of magnitude less than the number resulting from a multiplication of the number of rows and the number of columns of said solid state radiation detection panel.

* * * * *